United States Patent [19]
Ito et al.

[11] Patent Number: 5,218,247
[45] Date of Patent: Jun. 8, 1993

[54] CMIS CIRCUIT AND ITS DRIVER

[75] Inventors: Masao Ito; Takahiro Miki, both of Itami, Japan

[73] Assignee: Mitsubishi Denki Kabushiki Kaisha, Tokyo, Japan

[21] Appl. No.: 762,560

[22] Filed: Sep. 18, 1991

[30] Foreign Application Priority Data

Sep. 21, 1990 [JP] Japan .................................. 2-252479

[51] Int. Cl.$^5$ .................... H03K 19/092; H03K 17/16
[52] U.S. Cl. ................................ 307/475; 307/443; 307/450; 307/451
[58] Field of Search ............... 307/443, 451, 450, 415, 307/542, 548, 558, 270

[56] References Cited

U.S. PATENT DOCUMENTS

| | | | |
|---|---|---|---|
| 4,825,102 | 4/1989 | Iwasawa et al. .................. | 307/558 |
| 4,959,560 | 9/1990 | Ootani ............................... | 307/451 |
| 5,059,823 | 10/1991 | Ahsanullah ...................... | 307/542 |
| 5,089,722 | 2/1992 | Amedeo ........................... | 307/451 |

FOREIGN PATENT DOCUMENTS 0189571  6/1986  European Pat. Off. .

Primary Examiner—Edward P. Westin
Assistant Examiner—Richard Roseen
Attorney, Agent, or Firm—Morrison Law Firm

[57] ABSTRACT

A semiconductor integrated circuit includes a complementary MIS circuit including first PMIS and NMIS transistors with their drain electrodes connected together. The integrated circuit further includes a driving level-shift which includes a second PMIS transistor having its drain electrode grounded, and having its source electrode connected to the gate of the first PMIS transistor and to a $V_{DD}$ voltage supply terminal via a first resistor. The level-shift circuit further includes a second NMIS transistor having its drain electrode connected directly to the $V_{DD}$ voltage supply terminal, having its source electrode grounded via a second resistor, and having its gate electrode connected to the gate electrode of the second PMIS transistor. An input voltage is applied to the gate electrodes of the second PMIS and NMIS transistors.

10 Claims, 2 Drawing Sheets

CMIS CIRCUIT AND ITS DRIVER

This invention relates to a semiconductor integrated circuit, and more particularly to a semiconductor integrated circuit including a complementary metal-insulator-semiconductor (MIS) circuit and a circuit for driving the MIS circuit.

BACKGROUND OF THE INVENTION

As one example of a conventional complementary MIS (CMIS) circuit, a buffer circuit 1 is shown in FIG. 1. The buffer circuit 1 shown uses MOS transistors as MIS transistors. The buffer circuit 1 includes a P-channel MOS (hereinafter referred to as PMOS) transistor 11 having its source electrode $S_1$ connected to a power supply terminal 2, and an N-channel MOS (hereinafter referred to as NMOS) transistor 12 having its source electrode $S_2$ grounded. The MOS transistors 11 and 12 have their respective gate electrodes $G_1$ and $G_2$ connected in common to an input terminal 3, and have their respective drain electrodes $D_1$ and $D_2$ connected in common to an output terminal 4.

A conventional CMOS circuit such as one described above has a problem that when the circuit changes from one stable state to the other stable state, a large shoot-through current flows. Let it be assumed that an input voltage $V_{IN}$ which slopes slightly when it rises and falls as shown in FIG. 2 is applied to the input terminal 3 as an input signal. When the input voltage $V_{IN}$ rises from a low level to a high level, both of the PMOS and NMOS transistors 11 and 12 become concurrently conductive during an interval A between a point $a_1$ when the input voltage reaches the threshold voltage $V_{TN}$ of the NMOS transistor 12 and a point $a_2$ when the input voltage reaches the threshold voltage $V_{TP}$ of the PMOS transistor 11, which causes a large current ("shoot-through current") to flow through the two MOS transistors of the circuit.

Similarly, when the input voltage $V_{IN}$ falls from the high level to the low level, a shoot-through current will flow during an interval B between a point $b_1$ when the input voltage $V_{IN}$ reaches the threshold voltage $V_{TP}$ of the PMOS transistor 11 and a point $b_2$ when the input voltage reaches the threshold voltage $V_{TN}$ of the NMOS transistor 12.

Such a shoot-through current increases the power consumption in the circuit. Increase of power consumption is particularly significant in a circuit in which large-sized transistor are used as the transistors 11 and 12 in order to increase driving capability, because a very large shoot-through current will flow when the circuit state is inverted.

Accordingly, it is an object of the present invention to provide a complementary MIS integrated circuit comprising PMIS and NMIS transistors with their drain electrodes connected together, which has a shoot-through current reduced by making zero or as short as possible an interval during which both transistors become concurrently conductive at the time when the circuit changes from one stable state to the other.

SUMMARY OF THE INVENTION

An integrated circuit according to the present invention includes a complementary MIS (CMIS) circuit comprising a first PMIS transistor and a first NMIS transistor which have their drain electrodes connected in common to an output terminal of the integrated circuit. The integrated circuit includes further a level-shift circuit for driving the CMIS circuit. The level-shift circuit includes a second PMIS transistor having its drain electrode grounded and having its source electrode connected through a first resistor to a $V_{DD}$ voltage supply terminal, and a second NMIS transistor having its drain electrode connected directly to the $V_{DD}$ voltage supply terminal and having its source electrode grounded through a second resistor. An input terminal to which an input voltage $V_{IN}$ is applied is connected to the commonly connected gate electrodes of the second PMIS and NMIS transistors. The gate electrodes of the first PMIS and NMIS transistors of the complementary MIS circuit are connected to the source electrodes of said second PMIS and NMIS transistors, respectively.

According to the present invention, the first PMIS transistor and the first NMIS transistor which constitute the CMIS circuit are not directly driven with the input voltage such as one shown in FIG. 2. Rather, the input voltage drives the second PMIS and NMIS transistors. The first PMIS and NMIS transistors are separately driven with source outputs of the second PMIS and NMIS transistors, respectively.

With the above-described arrangement, when the input voltage rises, the source output of the second PMIS transistor or the gate input of the first PMIS transistor reaches the threshold voltage value $V_{TP}$ of the first PMIS transistor earlier than the input voltage and, when the input voltage falls, it reaches the threshold voltage $V_{TP}$ value later than the input voltage. On the other hand, when the input voltage rises, the source output of the second NMIS transistor or the gate input of the first NMIS transistor reaches the threshold voltage value $V_{TN}$ of the first NMIS transistor later than the input voltage and, when the input voltage falls, it reaches the threshold voltage value $V_{TN}$ earlier than the input voltage. Thus, intervals during which both of the first PMIS transistor and the first NMIS transistor become simultaneously conductive are eliminated or minimized.

DESCRIPTION OF PREFERRED EMBODIMENT

Now, the integrated circuit of the present invention is described in detail with reference to one embodiment shown in FIG. 3.

Figure 3:
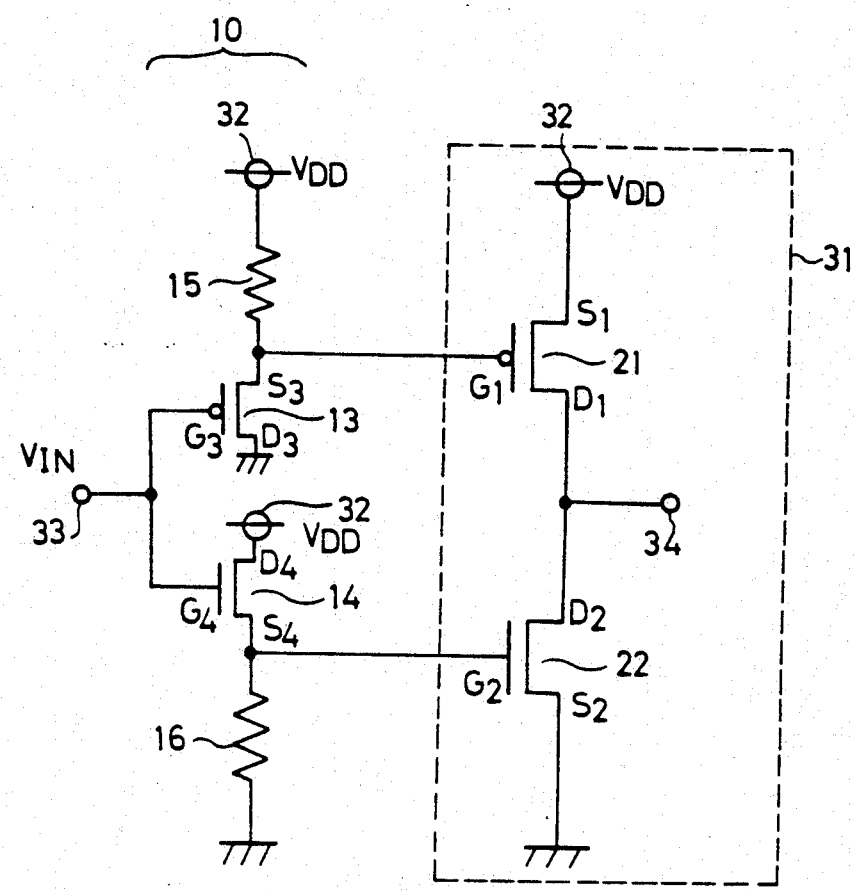
FIG. 3 shows an integrated circuit according to one embodiment of the present invention. which comprises a CMIS circuit and a circuit for driving the CMIS circuit.

The integrated circuit shown in FIG. 3 comprises a CMIS buffer circuit 31 and a level-shift circuit 10 for driving the buffer circuit 31. In this embodiment, MOS transistors are used as transistors which constitute the buffer circuit 31 and the buffer circuit driving level-shift circuit 10, but any suitable MIS transistors other than MOS transistors can be used in place of the MOS transistors.

The buffer circuit 31 includes a first PMOS transistor 21 and a first NMOS transistor 22. The drain electrodes $D_1$, $D_2$ of the first PMOS and NMOS transistors 21, 22 are connected in common to an output terminal 34. The first PMOS transistor 21 has its source electrode $S_1$ connected to a $V_{DD}$ voltage supply terminal 32, and the first NMOS transistor 22 has its source electrode $S_2$ grounded.

The buffer circuit driving level-shift circuit 10 includes a second PMOS transistor 13 and a second NMOS transistor 14. The gate electrodes $G_3$ and $G_4$ of the second PMOS and NMOS transistors 13 and 14 are connected in common to an input terminal 33 to which an input voltage $V_{IN}$ is applied. The second PMOS transistor 13 has its drain electrode $D_3$ grounded, and has its source electrode $S_3$ connected via a resistor 15 to the $V_{DD}$ voltage supply terminal 32. The second NMOS transistor 14 has its drain electrode $D_4$ connected directly to the $V_{DD}$ voltage supply terminal 32, and has its source electrode $S_4$ grounded through a resistor 16.

The source electrode $S_3$ of the second PMOS transistor 13 is connected also to the gate electrode $G_1$ of the first PMOS transistor 21, and the source electrode $S_4$ of the second NMOS transistor 14 is connected also to the gate electrode $G_2$ of the first NMOS transistor 22.

The input voltage $V_{IN}$ is applied to the gate electrodes $G_3$ and $G_4$ of the second PMOS and NMOS transistors 13 and 14, of the level-shift circuit 10. A voltage developed at the junction of the source electrode $S_3$ of the second PMOS transistor 13 and the resistor 15 is applied as an input to the gate electrode $G_1$ of the first PMOS transistor 21 of the buffer circuit 31. Similarly, a voltage developed at the junction of the source electrode $S_4$ of the second NMOS transistor 14 and the resistor 16 is applied as an input to the gate electrode $G_2$ of the first NMOS transistor 22 of the buffer circuit 31. The output signal of the buffer circuit 31 is developed at the output terminal 34 at which the drain electrode $D_1$ of the first PMOS transistor 21 and the drain electrode $D_2$ of the first NMOS transistor 22 are connected together.

Now, the operation of the integrated circuit of the present invention shown in FIG. 3 is described with reference to the signal voltage waveforms shown in FIG 4.

Figure 4:
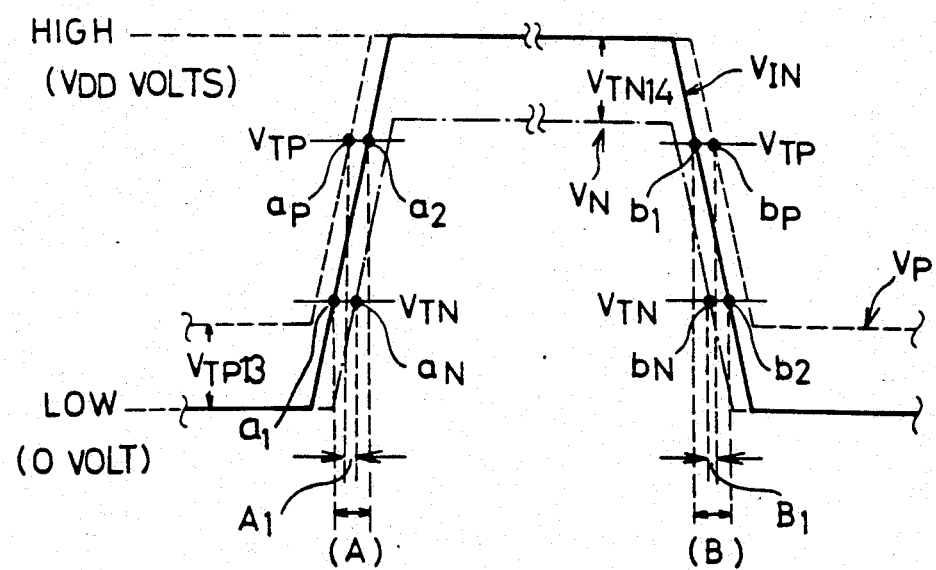
FIG. 4 shows waveforms of signal voltages at various portions of the integrated circuit shown in FIG. 3, which are helpful in understanding the operation of the FIG. 3 circuit.

The input voltage $V_{IN}$ applied to the input terminal 33 is shown by a solid line in FIG. 4. The input voltage $V_{IN}$ changes between a low level represented by 0 volt (ground potential) and a high level represented by $V_{DD}$ volts in FIG. 4.

When the input voltage $V_{IN}$ is applied to the input terminal 33, a signal voltage $V_P$ indicated by a broken line is applied to the gate electrode $G_1$ of the first PMOS transistor 21. The signal voltage $V_P$ is higher than or level-shifted from the input voltage $V_{IN}$ by an amount equal to the gate-source threshold voltage $V_{TP13}$ of the second PMOS transistor 13. The highest value of the signal voltage $V_P$, however, is limited to the supply voltage $V_{DD}$, and, therefore, it is $V_{DD}$ volts which is equal to the highest value of the input voltage $V_{IN}$. Similarly, in response to the application of the input voltage $V_{IN}$, a signal voltage $V_N$ indicated by a dash-and-dot line in FIG. 4 is applied to the gate electrode $G_2$ of the first NMOS transistor 22. The signal voltage $V_N$ is lower than or level-shifted from the input voltage $V_{IN}$ by an amount equal to the gate-source threshold voltage $V_{TN14}$ of the second NMOS transistor 14. The lowest value of the signal voltage $V_N$, however, is limited to the ground potential which is equal to the lowest value of the input voltage $V_{IN}$.

The signal voltages $V_P$ and $V_N$ are applied to the gate electrodes $G_1$ and $G_2$ of the first PMOS and NMOS transistors 21 and 22, respectively, in responses to the application of the input voltage $V_{IN}$ to the terminal 33, and, accordingly, when the input voltage $V_{IN}$ rises from the low level (ground potential) to the high level ($V_{DD}$ volts), the voltage at the gate electrode $G_2$ of the first NMOS transistor 22 reaches the threshold voltage $V_{TN}$ of the first NMOS transistor 22 at a time $a_N$ which is delayed from a time $a_1$ at which the input voltage $V_{IN}$ reaches a voltage corresponding to the threshold voltage $V_{TN}$, so the first NMOS transistor 22 is turned on at the time $a_N$.

Figure 1:
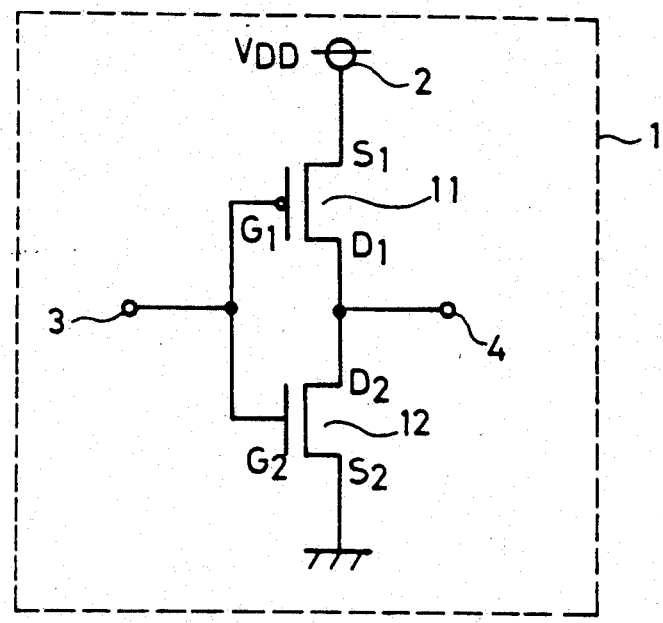
FIG. 1 shows an example of a conventional complementary MIS (CMIS) integrated circuit.
Figure 2:
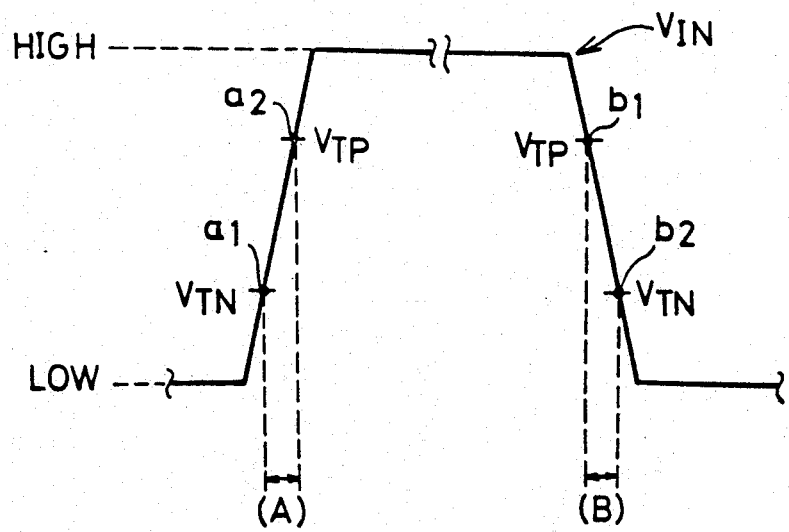
FIG. 2 shows an input voltage waveform which is helpful in understanding the operation of the CMIS circuit of FIG. 1.

On the other hand, the voltage at the gate electrode $G_1$ of the first PMOS transistor 21 reaches the threshold voltage $V_{TP}$ of the first PMOS transistor 21 at a time $a_P$ which is earlier than a time $a_2$ at which the input voltage $V_{IN}$ reaches a voltage corresponding to the threshold voltage $V_{TP}$, so the first PMOS transistor 21 is turned off at the time $a_P$. As stated above, since, when the input voltage $V_{IN}$ rises from the low level to the high level, the first PMOS transistor 21 is turned off at the time $a_P$ which is earlier than the time $a_2$ at which the input voltage $V_{IN}$ reaches the voltage corresponding to $V_{TP}$, whereas the first NMOS transistor 22 is turned on at the time $a_N$ which is later than the time $a_1$ at which the input voltage $V_{IN}$ reaches the voltage corresponding to $V_{TN}$, an interval $A_1$ during which both transistors 21 and 22 are concurrently off results, thus eliminating the interval A (FIG. 2) during which both of the PMOS and NMOS transistors 11 and 12 of the conventional CMOS circuit shown in FIG. 1 are concurrently conductive.

When the input voltage $V_{In}$ falls from the high level ($V_{DD}$ volts) to the low level (ground potential), the gate voltage $V_P$ of the first PMOS transistor 21 reaches the threshold voltage $V_{TP}$ of the first PMOS transistor 21 at a time $b_P$ which is later than a time $b_1$ at which the input voltage $V_{IN}$ decreases to the voltage corresponding to $V_{TP}$. Thus, the first PMOS transistor 21 is turned on at the time $b_P$. On the other hand, the gate voltage $V_N$ of the first NMOS transistor 22 decreases to the threshold voltage $V_{TN}$ of the first NMOS transistor 22 at a time $b_N$ which is earlier than a time $b_2$ at which the input voltage $V_{IN}$ decreases to the voltage corresponding to the threshold voltage $V_{TN}$. Thus, the first NMOS transistor 22 is turned off at the time $b_N$. Like this, when the input voltage $V_{IN}$ falls from the high level to the low level, the first NMOS transistor 22 is turned off at the time $b_N$ which is earlier than the time $b_2$ at which the input voltage $V_{IN}$ reaches the voltage corresponding to $V_{TN}$, and the first PMOS transistor 21 is turned on at the time $b_P$ which is later than the time $b_1$ at which the input voltage $V_{IN}$ reaches the voltage corresponding to $V_{TP}$. Thus, in this case, too, a time interval $B_1$ during which both of the first PMOS transistor 21 and the first NMOS transistor 22 are concurrently off results, thus eliminating the interval B (FIG. 2) during which both of the PMOS and NMOS transistors 11 and 12 of the conventional CMOS circuit of FIG. 1 are concurrently conductive.

As described above, according to the present invention, the time intervals during which both transistors of the CMIS circuit of the buffer circuit 31 are concurrently conductive when the input voltage $V_{IN}$ changes are greatly reduced relative to the corresponding time intervals in conventional CMIS circuits or eliminated. Accordingly, the time intervals during which shoot-through current is conducted when the state of the circuit is inverted are reduced or eliminated, and the power consumed is reduced accordingly.

The time intervals during which both transistors of the buffer circuit 31 are concurrently conductive can be reduced substantially to zero or eliminated by appropriately selecting the threshold voltages $V_{TP}$ and $V_{TN}$ of the respective second PMIS and NMIS transistors, such as the PMOS and NMOS transistors 13 and 14, of the buffer circuit driving level shift circuit 10 so that appropriate amounts of level shift is given to the input voltage $V_{IN}$.

What is claimed is:

1. A semiconductor integrated circuit comprising:
   a complementary MIS circuit;
   said complementary MIS circuit including a first PMIS transistor and a first NMIS transistor;
   a drain electrode of said first PMIS transistor and a drain electrode of said first NMIS transistor being connected in common to an output terminal of the semiconductor integrated circuit;
   a driving level-shift circuit;
   said driving level-shift circuit including a second PMIS transistor having its drain electrode grounded and having its source electrode connected to a $V_{DD}$ voltage supply terminal through a first resistor, and a second NMIS transistor having its drain electrode connected directly to the $V_{DD}$ voltage supply terminal and having its source electrode grounded through a second resistor;
   a gate electrode of said second NMIS transistor being connected to a gate electrode of said second PMIS transistor;
   a gate electrode of said first PMIS transistor is connected to a source electrode of said second PMIS transistor;
   a gate electrode of said first NMIS transistor is connected to a source electrode of said second NMIS transistor; and
   an input voltage is applied to the interconnected gate electrodes of said second PMIS transistor and said second NMIS transistor.

2. A semiconductor integrated circuit according to claim 1 wherein:
   said second PMIS transistor and second NMIS transistor which form said level-shift circuit each have a gate-source threshold voltage; and
   said second PMIS transistor and said second NMIS transistor being effective for shifting the level of said input voltage an amount corresponding to said gate-source threshold voltage of each such that when said input voltage rises from a lower level to a higher level, the time at which said first PMIS transistor is turned off is advanced and the time at which said first NMIS transistor is turned on is delayed, and when said input voltage falls from the higher level to the lower level, the time at which said first NMIS transistor is turned off is advanced and the time at which said first PMIS transistor and first NMIS transistor of said complementary MIS circuit are concurrently rendered conductive when said input voltage changes is minimized.

3. A semiconductor integrated circuit according to claim 1 wherein said first and second PMIS transistors are PMOS transistors, and said first and second NMIS transistors are NMOS transistors.

4. An electronic circuit comprising:
   a PMIS transistor;
   an NMIS transistor;
   drain of said PMIS transistor and said NMIS transistor being connected together to provide an output from said electronic circuit;
   a source of said PMIS transistor being connected to a voltage source;
   a source of said NMIS transistor being connected to ground;
   means for feeding an input signal to gates of said PMIS transistor and said NMIS transistor;
   said means for feeding including means for shifting minimum level and a signal waveform of said input signal, fed to said gate of said PMIS transistor, to a voltage higher than ground and the input signal respectively, whereby turn-off of said PMIS transistor is advanced during positive transitions of said input signal and turn-on is delayed during negative transitions of said input signal; and
   said means for feeding including means for shifting a maximum level and the signal waveform of said input signal, fed to said gate of said NMIS transistor, to a voltage lower than said voltage source and said input signal, whereby turn-on of said NMIS transistor is delayed during positive transitions of said input signal and turn-off is advanced during negative transitions of said input signal, whereby the advance of turn-off of said PMIS transistor and the delay of the turn-on of said NMIS transistor reduces a time during which both said PMIS and said NMIS transistor are turned on simultaneously during said positive transitions, and the delay of turn-on of said PMIS transistor and the advance of turn-off of said NMIS transistor reduces a time during which both said PMIS and said NMIS transistor are turned on simultaneously during said negative transitions.

5. An electronic circuit comprising:
   a PMIS transistor;
   an NMIS transistor;
   drains of said PMIS transistor and said NMIS transistor being connected together to provide an output from said electronic circuit;
   a source of said PMIS transistor being connected to a voltage source;
   a source of said NMIS transistor being connected to ground;
   means for feeding an input signal to gates of said PMIS transistor and said NMIS transistor;
   said means for feeding including means for shifting a minimum level and a signal waveform of said input signal, fed to said gate of said PMIS transistor, to a voltage higher than ground and the input signal, respectively, whereby turn-off of said PMIS transistor is advanced during positive transitions of said input signal and turn-on is delayed during negative transitions of said input signal;
   said means for feeding including means for shifting a maximum level and the signal waveform of said input signal, fed to said gate of said NMIS transistor, to a voltage lower than said voltage source and said input signal, whereby turn-on of said NMIS transistor is delayed during positive transitions of said input signal and turn-off is advanced during negative transitions of said input signal, whereby the advance of turn-off of said PMIS transistor and the delay of the turn-on of said NMIS transistor reduces a time which both said PMIS and said NMIS transistor are turned on simultaneously during said positive transitions, and the delay of turn-on of said PMIS transistor and the advance of turn-off of said NMIS transistor reduces a time during which both said PMIS and said NMIS transistor are turned on simultaneously during said negative transitions; and said means for feeding further including:

a second PMIS transistor having its source connected through a resistor to a voltage source and having its drain grounded;

said input signal being connected to a gate of said second PMIS transistor; and a gate of said PMIS transistor being connected to a junction of said resistor and said source of said second PMIS transistor, whereby a gate threshold of said second PMIS transistor increases a minimum signal voltage fed to said gate of said PMIS transistor.

6. Apparatus according to claim 5, wherein said means for feeding further includes:

a second NMIS transistor having its drain connected to a voltage source and having its source connected through a resistor to ground;

said input signal being connected to a gate of said second NMIS transistor; and a gate of said NMIS transistor being connected to a junction of said resistor and said source of said second NMIS transistor, whereby a gate threshold of said second NMIS transistor decreases a minimum signal voltage fed to said gate of said NMIS transistor.

7. Apparatus according to claim 4, wherein said electronic circuit is an integrated circuit.

8. A semiconductor integrated circuit comprising:

a complementary pair of transistors consisting of a PMIS transistor and an NMIS transistor;

source-drain paths of said PMIS transistor and said NMIS transistor being connected in series between a voltage source and ground;

an input terminal for a voltage signal;

first means between said input terminal and a gate of said PMIS transistor for increasing a level of a minimum and a signal waveform of said voltage signal fed to said gate of said PMIS transistor; and second means between said input terminal and a gate of said NMIS transistor for decreasing a level of a maximum and said signal waveform of said voltage signal fed to said gate of said NMIS transistor, whereby a time when said PMIS transistor and said NMIS transistor are turned on simultaneously is minimized by said increasing and decreasing of levels.

9. A semiconductor integrated circuit comprising:

a complementary pair of transistors consisting of a PMIS transistor and an NMIS transistor;

source-drain paths of said PMIS transistor and said NMIS transistor being connected in series between a voltage source and ground;

an input terminal for a voltage signal;

first means between said input terminal and a gate of said PMIS transistor for increasing a level of a minimum and a signal waveform of said voltage signal fed to said gate of said PMIS transistor;

said first means including:

a second PMIS transistor having its source connected through a resistor to a voltage source and its drain connected to ground;

said gate of said PMIS transistor being connected to a junction of said source of said second PMIS transistor and said resistor; and said voltage signal being connected to a gate of said second PMIS transistor; and second means between said input terminal and a gate of said NMIS transistor for decreasing a level of a maximum and said signal waveform of said voltage signal fed to said gate of said NMIS transistor, whereby a time when said PMIS transistor and said NMIS transistor are turned on simultaneously is minimized by said increasing and decreasing of levels.

10. A semiconductor integrated circuit comprising:

a complementary pair of transistors consisting of a PMIS transistor and an NMIS transistor;

source-drain paths of said PMIS transistor and said NMIS transistor being connected in series between a voltage source and ground;

an input terminal for a voltage signal;

first means between said input terminal and a gate of said PMIS transistor for increasing a level of a minimum and a signal waveform of said voltage signal fed to said gate of said PMIS transistor; and second means between said input terminal and a gate of said NMIS transistor for decreasing a level of a maximum and said signal waveform of said voltage signal fed to said gate of said NMIS transistor, whereby a time when said PMIS transistor and said NMIS transistor are turned on simultaneously is minimized by said increasing and decreasing of levels; and said second means including:

a second NMIS transistor having its source connected through a resistor to ground and its drain connected to said voltage source;

said gate of said NMIS transistor being connected to a junction of said source of said second NMIS transistor and said resistor; and said voltage signal being connected to a gate of said second NMIS transistor.

* * * * *